US008441788B2

(12) United States Patent
Xu

(10) Patent No.: US 8,441,788 B2
(45) Date of Patent: May 14, 2013

(54) SERVER

(75) Inventor: Ji-Peng Xu, Shanghai (CN)

(73) Assignee: Inventec Corporation, Taipei (TW)

( * ) Notice: Subject to any disclaimer, the term of this patent is extended or adjusted under 35 U.S.C. 154(b) by 351 days.

(21) Appl. No.: 13/013,773

(22) Filed: Jan. 25, 2011

(65) Prior Publication Data
US 2012/0134106 A1    May 31, 2012

(30) Foreign Application Priority Data
Nov. 30, 2010 (CN) .......................... 2010 1 0575824

(51) Int. Cl.
*H05K 7/20* (2006.01)
(52) U.S. Cl.
USPC ................. 361/679.46; 361/679.48; 361/688; 361/689; 361/724; 361/725
(58) Field of Classification Search ........................ None
See application file for complete search history.

(56) References Cited

U.S. PATENT DOCUMENTS

| | | | | |
|---|---|---|---|---|
| 6,498,716 B1* | 12/2002 | Salinas et al. | ................. | 361/610 |
| 7,252,524 B1* | 8/2007 | Johnson et al. | ............... | 439/210 |
| 7,394,667 B2* | 7/2008 | Kelly et al. | .................... | 361/823 |
| 7,522,426 B2* | 4/2009 | Koga et al. | .................... | 361/788 |
| 7,606,014 B2* | 10/2009 | Ziegler et al. | ................ | 361/93.1 |
| 7,718,889 B2* | 5/2010 | Rasmussen et al. | ............ | 174/50 |
| 8,174,821 B2* | 5/2012 | Fontana et al. | ............... | 361/601 |
| 2006/0120026 A1* | 6/2006 | Wiant et al. | .................... | 361/614 |

* cited by examiner

*Primary Examiner* — Boris Chervinsky
(74) *Attorney, Agent, or Firm* — Jianq Chyun IP Office

(57) ABSTRACT

A server including a rack, chassis, a power module, first copper columns, and second copper columns is provided. The rack has a front end and an opposite back end. The chassis are disposed in the rack and suitable for being pulled out from the front end. Each chassis contains a motherboard module. The power module is disposed in the rack. The first copper columns are fixed on the rack, electrically connected to the power module, and are suitable for electrically connecting an external power supply. The second copper columns are fixed on the rack and electrically connected to the power module and the motherboard modules. A high voltage from the external power supply is transmitted to the power module via the first copper columns. The power module converts the high voltage into a low voltage and transmits the low voltage to the motherboard modules via the second copper columns.

11 Claims, 4 Drawing Sheets

SERVER

CROSS-REFERENCE TO RELATED APPLICATION

This application claims the priority benefit of China application serial no. 201010575824.3, filed on Nov. 30, 2010. The entirety of the above-mentioned patent application is hereby incorporated by reference herein and made a part of specification.

BACKGROUND OF THE INVENTION

1. Field of the Invention

The invention generally relates to a server, and more particularly, to a rackmount server.

2. Description of Related Art

A server is a computer that serves other computers in a network system, and which often provides essential services (for example, hard disk and printing service) to users across the network system and allows the users to share various network resources. The infrastructure of a server is similar to that of a typical personal computer (PC) and is usually composed of a central processing unit (CPU), a memory, and input/output (I/O) devices, etc. Foregoing components in a server are connected by buses, the CPU and the memory are connected through north bridge chips, and the I/O devices are connected through south bridge chips. Servers have gone through three development stages based on their packaging as tower servers, rackmount servers focused on centralized performance, and blade servers focused on high-density computing.

Taking rackmount server as an example, a rackmount server is a server with standardized appearance, and which is used along with a case. A rackmount server can be considered as a tower server with optimized structure, and which is designed to save server space. Many specialized network equipments (for example, switches, routers, and hardware firewalls) adopt such a rackmount structure and are designed to have a flat, drawer-like structure. The width of a rackmount server is 19 inches, and the height thereof is in units of U (1 U=1.75 inches=44.45 mm). For example, 1 U, 2 U, 3 U, 4 U, 5 U, and 7 U servers are the most commonly used servers.

The size of a server case usually conforms to an industry standard to be from 22 U to 42 U. Demountable sliding brackets are disposed in the server case at height intervals of U such that a user can place a server, a hub, a storage cabinet, and other network equipments and adjust their heights flexibly according to the actual requirement. After the server is placed, all the I/O cables thereof are ran out from the back of the server case (all the interfaces of the rackmount server are also at the back) and arranged in a cable tray of the server case and labeled for the convenience of management.

Along with the increase in the density of computing and storage devices in a server case, the large amount of cables and power lines makes it very untidy, and the accumulation of these cables and power lines at the back of the server case blocks air circulation and makes heat radiation very difficult.

SUMMARY OF THE INVENTION

Accordingly, the invention is directed to a server with reduced number of cables.

The invention provides a server including a rack, a plurality of chassis, a power module, at least one first copper column, and at least one second copper column. The rack has a front end and an opposite back end. The chassis are disposed in the rack and suitable for being pulled out from the front end. Each of the chassis contains a motherboard module. The power module is disposed in the rack. The first copper column is fixed on the rack and electrically connected to the power module. The first copper column is suitable for electrically connecting an external power supply. The second copper column is fixed on the rack and electrically connected to the power module and the motherboard modules. A high voltage supplied by the external power supply is transmitted to the power module via the first copper column. The power module converts the high voltage into a low voltage and transmits the low voltage to the motherboard modules via the second copper column.

According to an embodiment of the invention, the first copper column and the second copper column are disposed at the back end of the rack.

According to an embodiment of the invention, the first copper column and the second copper column are respectively extended from the bottom of the rack to the top of the rack.

According to an embodiment of the invention, there are two first copper columns and two second copper columns, and the two second copper columns are disposed between and in alignment with the two first copper columns.

According to an embodiment of the invention, each of the chassis contains a transfer plate and a DC power panel located on the transfer plate, wherein the DC power panel is suitable for receiving the low voltage and converting the low voltage into a working voltage of the corresponding motherboard module.

According to an embodiment of the invention, the server further includes a first back panel and a plurality of network cards. The first back panel is disposed at the back end of the rack and has a first surface and an opposite second surface. The first surface faces the chassis. The first back panel has a plurality of first connectors on the first surface and a plurality of first network ports on the second surface. The network cards are respectively disposed on the motherboard modules. The first connectors are suitable for being electrically connected to the network cards. The first network ports are suitable for connecting external cables.

According to an embodiment of the invention, the transfer plate is electrically connected to the first connectors and the motherboard modules, and the network cards are connected to the first connectors through the transfer plate.

According to an embodiment of the invention, the server further includes a second back panel. The second back panel is disposed at the back end of the rack and has a third surface and an opposite fourth surface. The third surface faces the chassis. The second back panel has a plurality of second connectors on the third surface and a plurality of second network ports on the fourth surface. The second connectors are suitable for being electrically connected to the network cards. The second network ports are suitable for connecting external cables.

According to an embodiment of the invention, when each of the motherboard modules issues a power-on signal, the corresponding DC power panel receives the power-on signal and generates the working voltage and a working voltage ready signal (PGD_P12V) to the motherboard module, and the motherboard module is then powered on according to the working voltage ready signal.

According to an embodiment of the invention, the server further includes a cooling fan module and a radiator. The cooling fan module is disposed at a first side of the rack, and the radiator is disposed at a second side of the rack opposite to the first side. The motherboard modules are located between the cooling fan module and the radiator. A cooling air flow generated by the cooling fan module passes through the motherboard modules to reach the radiator.

According to an embodiment of the invention, the radiator is a water cooling radiator.

As described above, in a server provided by the invention, at least one first copper column and at least one second copper column are disposed such that an external power supply can supply power to the motherboard modules via the first copper column and the second copper column. Thereby, the number of cables in the server is reduced to simplify the circuit layout, and air circulation inside the server is promoted to improve the heat radiation efficiency.

These and other exemplary embodiments, features, aspects, and advantages of the invention will be described and become more apparent from the detailed description of exemplary embodiments when read in conjunction with accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
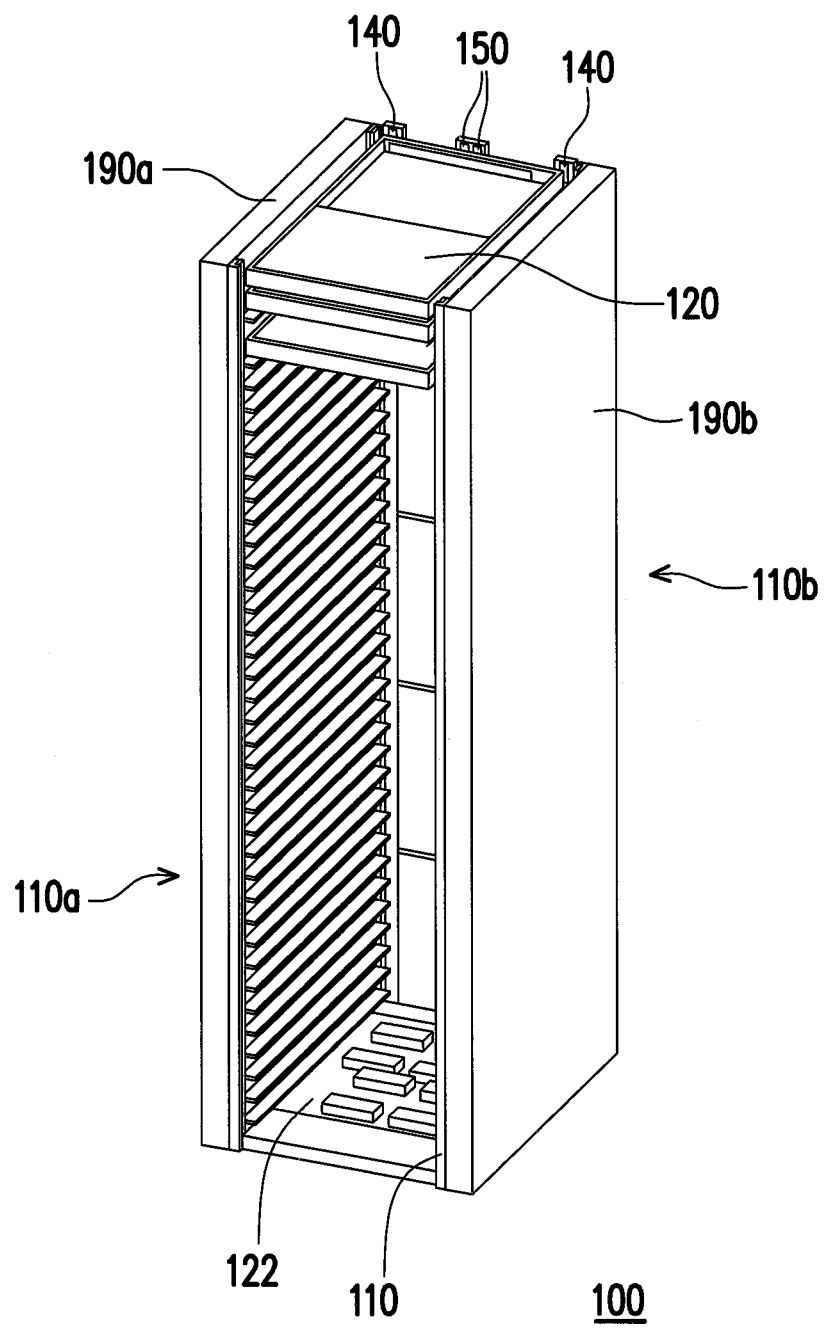
FIG. 1 is a perspective view illustrating some components of a server according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
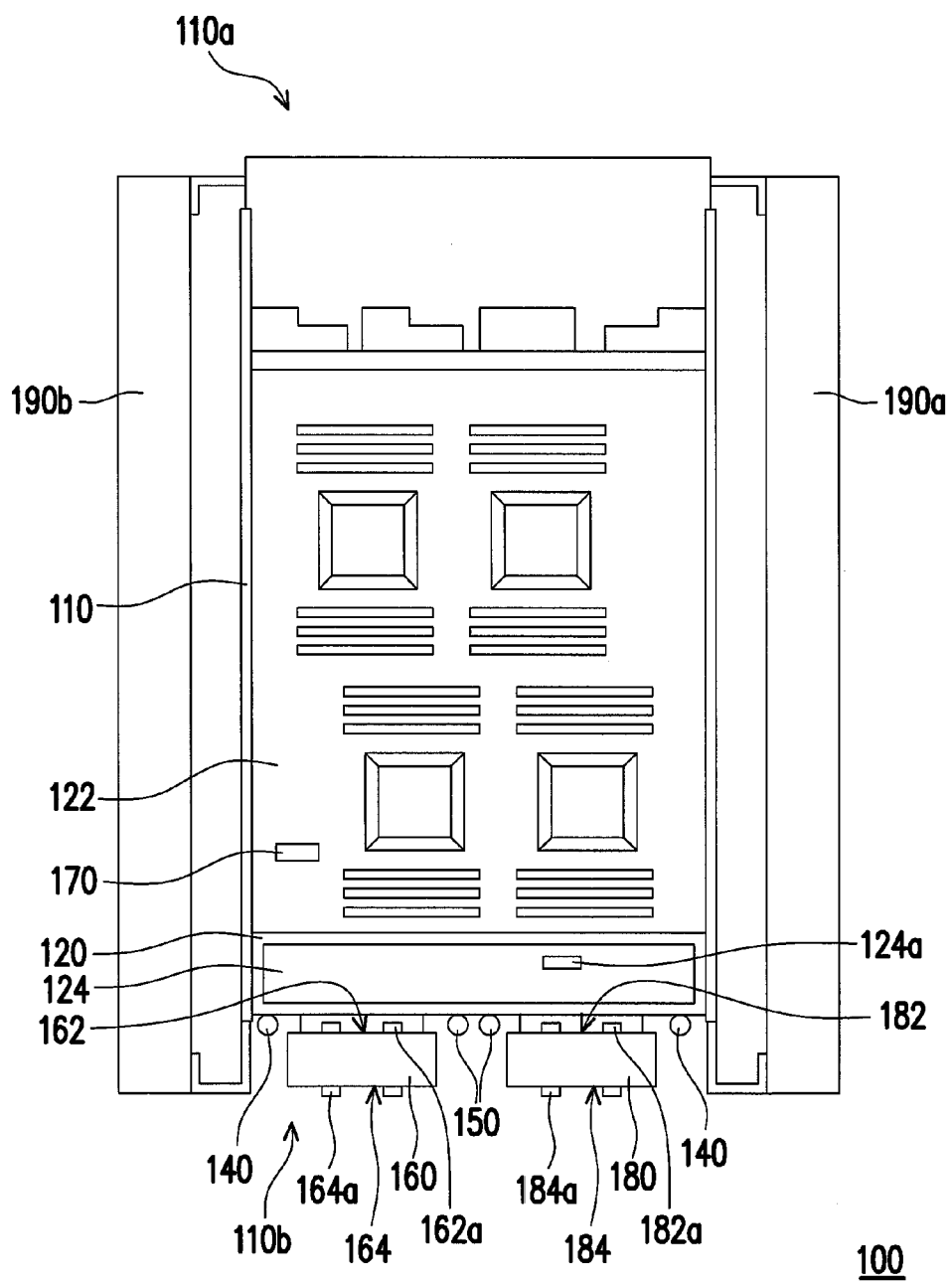
FIG. 2 and FIG. 3 are top views illustrating some components of the server in FIG. 1.
Figure 3:
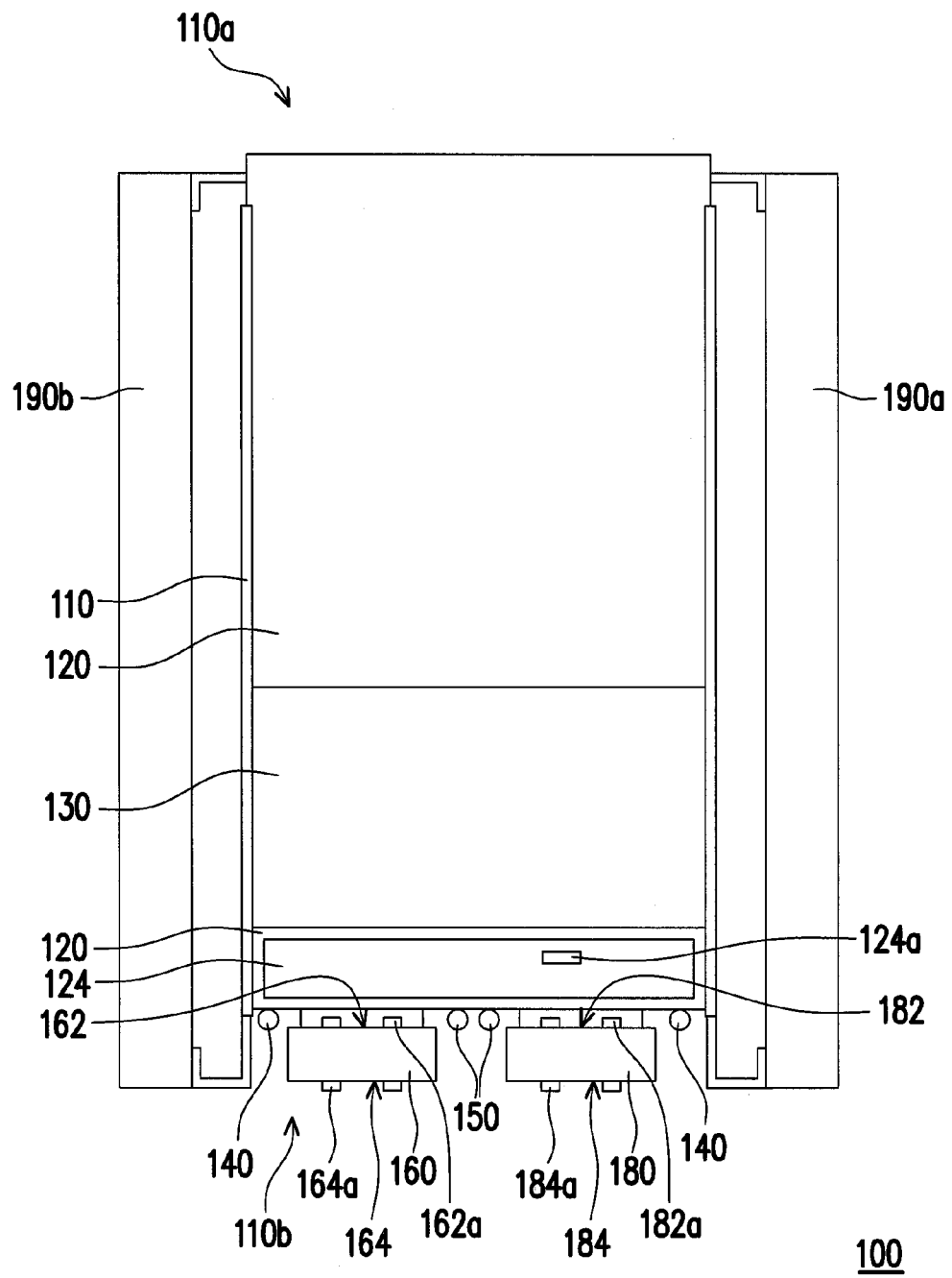

FIG. 1 is a perspective view illustrating some components of a server according to an embodiment of the invention. FIG. 2 and FIG. 3 are top views illustrating some components of the server in FIG. 1. Referring to FIG. 1 to FIG. 3, the server 100 in the present embodiment includes a rack 110, a plurality of chassis 120, a power module 130, at least one first copper column 140 (two are illustrated herein), and at least one second copper column 150 (two are illustrated herein). The rack 110 has a front end 110a and an opposite back end 110b. The chassis 120 are disposed in the rack 110 and suitable for being pulled out from the front end 110a. Each of the chassis 120 contains a motherboard module 122. In order to illustrate the structure of the server 100 clearly, only some of the chassis 120 and one motherboard module 122 at the bottom of the rack 110 are illustrated in FIG. 1.

The power module 130 is disposed in the rack 110. To be specific, the power module 130 is disposed in one of the chassis 120 and stacked together with the motherboard modules 122 in the rack 110. As shown in FIG. 3, in the present embodiment, the chassis 120 disposed with the power module 130 does not contain any motherboard module 122 as illustrated in FIG. 2. The chassis 120 in FIG. 2 and the chassis 120 in FIG. 3 are respectively placed at different heights in the rack 110.

The first copper columns 140 and the second copper columns 150 are both fixed on the rack 110. The first copper columns 140 are electrically connected to the power module 130 and suitable for electrically connecting an external power supply. The second copper columns 150 are electrically connected to the power module 130 and the motherboard modules 122. A high voltage supplied by the external power supply is transmitted to the power module 130 via the first copper columns 140, and the power module 130 converts the high voltage into a low voltage and transmits the low voltage to the motherboard modules 122 via the second copper columns 150.

Through the disposition of the first copper columns 140 and the second copper columns 150, the external power supply can supply power to the motherboard modules 122 via the first copper columns 140 and the second copper columns 150. Accordingly, the number of cables in the server 100 is reduced to simplify the circuit layout, and air circulation inside the server 100 is promoted to improve the heat radiation efficiency.

To be specific, in the present embodiment, the first copper columns 140 and the second copper columns 150 are disposed at the back end 110b of the rack 110 and respectively extended from the bottom of the rack 110 to the top of the rack 110 so that they can electrically connect the motherboard modules 122. Besides, the two second copper columns 150 are disposed between and in alignment with the two first copper columns 140. However, the disposition of the first copper columns 140 and the second copper columns 150 is not limited thereto, and in other embodiments, the first copper columns 140 and the second copper columns 150 may also be disposed in other manners.

Referring to FIG. 2, in the present embodiment, each chassis 120 contains a transfer plate 124 and a DC power panel 124a located on the transfer plate 124, wherein the DC power panel 124a is suitable for receiving the low voltage and converting the low voltage into a working voltage of the corresponding motherboard module 122.

Referring to FIG. 2 and FIG. 3, in the present embodiment, the server 100 further includes a first back panel 160 and a plurality of network cards 170 (only one is illustrated in FIG. 2) respectively disposed on the motherboard modules 122. The first back panel 160 is disposed at the back end 110b of the rack 110 and has a first surface 162 and an opposite second surface 164. The first surface 162 faces the chassis 120. The first back panel 160 has a plurality of first connectors 162a on the first surface 162 and a plurality of first network ports 164a on the second surface 164. The first connectors 162a are suitable for being electrically connected to the network cards 170, and the first network ports 164a are suitable for connecting external cables, so that the motherboard modules 122 can be connected to the external cables via the network cards 170 and the first back panel 160. Thereby, it is not needed to directly connect the external cables to the motherboard modules 122, and a user can conveniently plug or unplug any cable at the back end 110b of the rack 110.

In the present embodiment, the transfer plates 124 are electrically connected to the first connectors 162a and the motherboard modules 122, and the network cards 170 are connected to the first connectors 162a via the transfer plates 124. When each motherboard module 122 issues a power-on signal, the corresponding DC power panel 124a receives the power-on signal and generates the working voltage and a working voltage ready signal (PGD_P12V) to the motherboard module 122, and the motherboard module 122 is then powered on according to the working voltage ready signal.

In the present embodiment, the server 100 further includes a second back panel 180. The second back panel 180 is disposed at the back end 110b of the rack 110 and has a third surface 182 and an opposite fourth surface 184. The third surface 182 faces the chassis 120. The second back panel 180 has a plurality of second connectors 182a on the third surface 182 and a plurality of second network ports 184a on the fourth surface 184. The second connectors 182a are suitable for being electrically connected to the network cards 170, and the second network ports 184a are suitable for connecting external cables. Besides via the network cards 170 and the first back panel 160, the motherboard modules 122 may also be connected to external cables via the network cards 170 and the second back panel 180. Thus, when the first back panel 160 fails, the motherboard modules 122 can still be connected to external cables via the network cards 170 and the second back panel 180. On the other hand, when the second back panel 180 fails, the motherboard modules 122 can still be connected to external cables via the network cards 170 and the first back panel 160.

Figure 4:
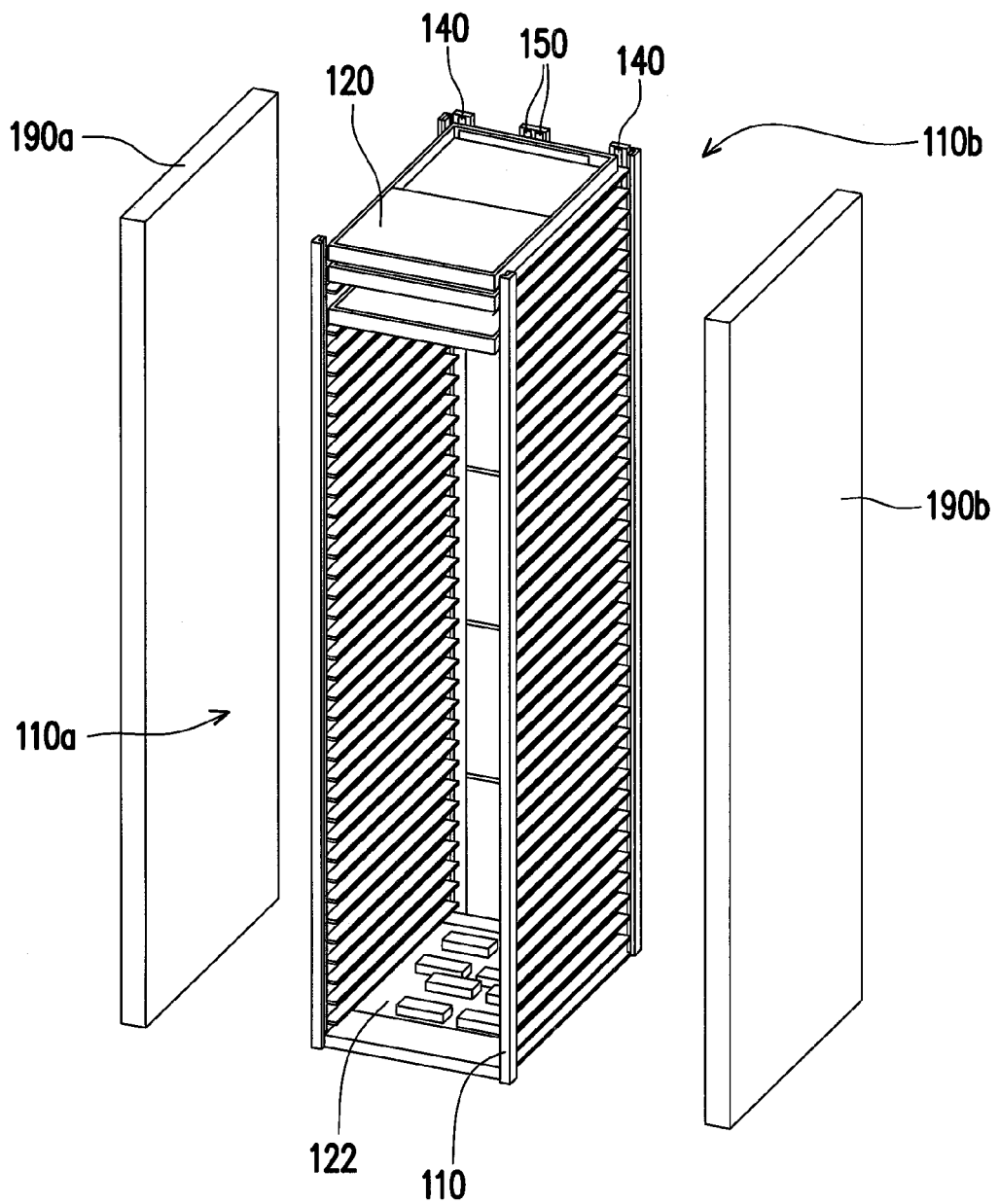
FIG. 4 is an explosion diagram of the server in FIG. 1.

FIG. 4 is an explosion diagram of the server in FIG. 1. Referring to FIG. 1 to FIG. 4, in the present embodiment, the server 100 further includes a cooling fan module 190a and a radiator 190b. The cooling fan module 190a is disposed at a first side of the rack 110, and the radiator 190b is disposed at a second side of the rack 110 opposite to the first side. The motherboard modules 122 are located between the cooling fan module 190a and the radiator 190b. Through such a disposition manner, a cooling air flow generated by the cooling fan module 190a passes through the motherboard modules 122 in the rack 110 to reach the radiator 190b, so that heat produced by the motherboard modules 122 can be dissipated. In the present embodiment, the radiator 190b may be a water cooling radiator. However, the invention is not limited thereto, and in other embodiments, the radiator 190b may also be any other suitable type of radiator.

In summary, in a server provided by the invention, at least one first copper column and at least one second copper column are disposed such that an external power supply can supply power to the motherboard modules via the first copper column and the second copper column. Thereby, the number of cables in the server is reduced to simplify the circuit layout, and air circulation inside the server is promoted to improve the heat radiation efficiency. In addition, connectors and network ports are disposed on back panels at the back end of the rack, and network cards are disposed in the motherboard modules, such that the motherboard modules can be connected to external cables via these network cards and back panels, and a user can conveniently plug or unplug any cable at the back end of the server.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A server, comprising:
    a rack, having a front end and an opposite back end;
    a plurality of chassis, disposed in the rack, suitable for being pulled out from the front end, wherein each of the chassis contains a motherboard module;
    a power module, disposed in the rack;
    at least one first copper column, fixed on the rack and electrically connected to the power module, wherein the first copper column is suitable for electrically connecting an external power supply; and
    at least one second copper column, fixed on the rack and electrically connected to the power module and the motherboard modules, wherein a high voltage supplied by the external power supply is transmitted to the power module via the first copper column, and the power module converts the high voltage into a low voltage and transmits the low voltage to the motherboard modules via the second copper column.

2. The server according to claim 1, wherein the first copper column and the second copper column are disposed at the back end of the rack.

3. The server according to claim 1, wherein the first copper column and the second copper column are respectively extended from a bottom of the rack to a top of the rack.

4. The server according to claim 1, wherein a number of the at least one first copper column is two, a number of the at least one second copper column is two, and the two second copper columns are disposed between and in alignment with the two first copper columns.

5. The server according to claim 1, wherein each of the chassis contains a transfer plate and a DC power panel located on the transfer plate, wherein the DC power panel is suitable for receiving the low voltage and converting the low voltage into a working voltage of the corresponding motherboard module.

6. The server according to claim 5 further comprising:
    a first back panel, disposed at the back end of the rack, having a first surface and an opposite second surface, wherein the first surface faces the chassis, and the first back panel has a plurality of first connectors on the first surface and a plurality of first network ports on the second surface; and
    a plurality of network cards, respectively disposed on the motherboard modules, wherein the first connectors are suitable for being electrically connected to the network cards, and the first network ports are suitable for connecting external cables.

7. The server according to claim 6, wherein the transfer plate is electrically connected to the first connectors and the motherboard modules, and the network cards are connected to the first connectors through the transfer plate.

8. The server according to claim 6 further comprising:
    a second back panel, disposed at the back end of the rack, having a third surface and an opposite fourth surface, wherein the third surface faces the chassis, the second back panel has a plurality of second connectors on the third surface and a plurality of second network ports on the fourth surface, the second connectors are suitable for being electrically connected to the network cards, and the second network ports are suitable for connecting external cables.

9. The server according to claim 5, wherein when each of the motherboard modules issues a power-on signal, the corresponding DC power panel receives the power-on signal and generates the working voltage and a working voltage ready signal to the motherboard module, and the motherboard module is powered on according to the working voltage ready signal.

10. The server according to claim 1 further comprising:
    a cooling fan module, disposed at a first side of the rack; and
    a radiator, disposed at a second side of the rack opposite to the first side, wherein the motherboard modules are located between the cooling fan module and the radiator, and a cooling air flow generated by the cooling fan module passes through the motherboard modules to reach the radiator.

11. The server according to claim 10, wherein the radiator is a water cooling radiator.

* * * * *